United States Patent [19]

Scholten et al.

[11] 4,039,972
[45] Aug. 2, 1977

[54] CRYSTAL CONTROLLED LOGIC GATE CLOCK PULSE GENERATOR

[75] Inventors: Rudy Dirk Anthonie Scholten; Antonius Gerardus Visser, both of Beekbergen, Netherlands

[73] Assignee: U.S. Philips Corporation, New York, N.Y.

[21] Appl. No.: 650,369

[22] Filed: Jan. 19, 1976

[30] Foreign Application Priority Data

Feb. 21, 1975 Netherlands .................. 7502054

[51] Int. Cl.² ............................................. H03B 5/36
[52] U.S. Cl. ........................... 331/108 D; 331/116 R; 331/158
[58] Field of Search ............... 331/108 D, 116 R, 158

[56] References Cited

U.S. PATENT DOCUMENTS

| | | |
|---|---|---|
| 3,829,790 | 8/1974 | Macrander .................. 331/116 R X |
| 3,911,378 | 10/1975 | Buchanan ....................... 331/116 R |

OTHER PUBLICATIONS

Byers, Jr., "Power Your Oscillator with ECL", Electronic Design, Aug. 1, 1968, pp. 70–71.

*Primary Examiner*—Siegfried H. Grimm
*Attorney, Agent, or Firm*—Frank R. Trifari

[57] ABSTRACT

A self-triggered clock pulse generator for high frequencies comprising an oscillating quartz crystal which is included in a loop together with a capacitor and a single, non-inverting gate. An averaging feedback is obtained by means of an inverting gate and an integrating circuit, which are connected in series between the output of the non-inverting gate and the input of the gate which is connected to the crystal.

7 Claims, 4 Drawing Figures

CRYSTAL CONTROLLED LOGIC GATE CLOCK PULSE GENERATOR

The invention relates to a device for the self-triggered generation of a series of cyclically recurring clock pulses, comprising a circuit loop including an oscillator element, a capacitor, and a first gating device, a first output of the circuit loop being connected to an input of an additional gate outside the said circuit loop. A device of this kind is known from German Offenlegungsschrift No. 2,031,843. The known device utilizes a piezoelectric ceramic oscillator element which, however, involves a number of drawbacks besides a number of advantages. For example, the temperature stability is not always sufficient. A further drawback of the circuit according to the same Offenlegungsschrift is that the signals on the two connections to the oscillator element are at relative phases of substantially 180°. This was found to hinder the attainment of a high frequency. In order to produce a self-triggered oscillator circuit, the circuit loop of the known device includes two series-connected NAND-gates. However, additional circuit elements (two resistors and a capacitor) are then required and moreover, each series-connected gate introduces its own inherent delay, so that the overall delay imposed on a signal is increased, and the maximum achievable frequency is limited.

Therefore, the invention has for its object to provide an oscillator which oscillates at a high frequency. The invention furthermore has for its object to realize an oscillator having a simple construction. The invention also has for its object to realize a self-triggered oscillator. It is another object of the invention to realize a temperature-independent oscillator circuit. It is yet another object of the invention to realize an oscillator circuit whose frequency is not very susceptible to variations in supply voltage. The said objects are achieved according to the invention, which is characterized in that the said circuit loop includes a series combination of a single non-inverting logic gate, a piezoelectric oscillator element the phase difference between the signals occuring on the two connections to which is less than 45° and said capacitor, a second output of the additional gate being connected, via a feedback line which includes an integrating network, to an input of the said non-inverting logic gate for the purpose of setting said gate.

The oscillator element may thus be, for example a quartz crystal, the signals on the outputs of which are substantially in phase with each other. In certain circumstances a ceramic oscillator element may alternatively be used, as long as the said phase difference is not excessive. A phase difference of substantially 180° as in the said German Offenlegungsschrift No. 2,031,843 is completely unacceptable. It is furthermore known per se to realize some of the afore-said objects of the invention separately. For example, German Pat. application No. 1,762,471 describes a simple oscillator which, however, is not always self-triggered. However, the present invention realizes a large number of objects at the same time, so that a simple, stable, self-triggered oscillator for oscillation at very high frequencies is obtained.

The said additional gate is preferably an inverting gate, the feedback line being connected, together with a line forming part of the said circuit loop to a single input of the said non-inverting logic gate. The non-inverting gate can thus be set to the centre of its operating range. The switching speed and hence the achievable frequency then become very high, while the shape of the oscillator pulses remains substantially symmetrical.

The said non-inverting logic gate may further be a Schottky-TTL-gate, or an ECL-gate. These are two feasible kinds of a gate having very short switching times.

The said additional gate preferably has at least one additional control input, a first signal appearing thereon being capable of blocking the said series combination, a second signal appearing thereon being capable of unblocking the said series combination. The oscillator circuit can thus be readily started and stopped by an additional signal.

An output of the circuit loop is preferably connected to a first input of a logic output gate, the said output gate being caused to continuously conduct as a result of the said blocking of the series combination, external clock pulses then being receivable on a second input of the said output gate. Externally generated clock pulses can thus also be readily allowed to pass.

An inverting delay line and a further inverting gate are preferably provided, it being possible to apply the said series of cyclically recurring clock pulses, directly as well as via the inverting delay line, to a relevant input of the said further inverting gate. The symmetry of the output pulse series can be influenced by such an addition of a comparatively small parallel-connected delay line. Notably, a doubling of the pulse repetition rate can thus be realized. It is also readily possible in this way to form a double clock pulse which alternately appears on two clock pulse lines.

The invention will be described in detail hereinafter with reference to Figures of the drawings.

Figure 1:
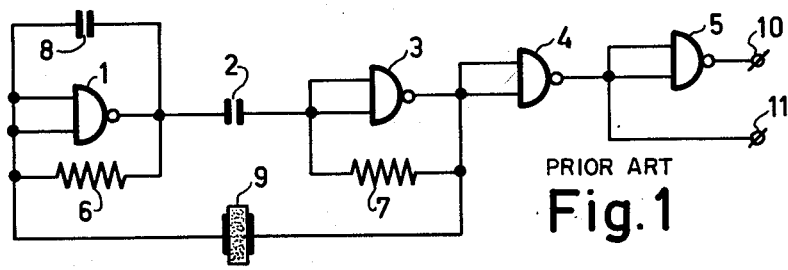
FIG. 1 shows an oscillator circuit according to the present state of the art.

FIG. 1 shows an oscillator circuit in accordance with FIG. 1 of the German Pat. Specification No. 2,031,843. The circuit comprises four NAND-gates 1, 3, 4, 5, two capacitors 2, 8, two resistors 6, 7 and one ceramic oscillator element 9. According to the said Patent Specification, rectangular pulses having rise and fall times of from 20 to 30 ns can be satisfactorily generated using such a circuit; this results in a clock pulse frequency of about 5 MHz. In many cases this will be sufficient; however, in some cases a higher frequency is required which, however, cannot always be realized, because the combined delay time of the two series-connected gates 1, 3 is too large. The resistors 6, 7 serve for feedback, the gates 1, 3 acting as a threshold switch. The capacitor 8 serves for the suppression of higher harmonics. The further gates 4, 5 serve to realize, if necessary, ratios of the pulse length to the intervals between successive pulses other than the ratio 1 : 1.

If the input of gate 1 becomes low during operation, the output of the said gate becomes high after one gate delay time. This signal is applied to the NAND-gate 3 via the coupling capacitor 2. The output thereof becomes low, after a further gate delay time, and this signal is applied to the element 9. If this element has performed one half cycle of its own fundamental oscillation at this instant, this input has also become low due to the oscillator action, because there is constantly a phase difference of approximately 180° between the signals on the two connections to the oscillator element. The oscillation frequency is determined by the stable fundamental frequency of the element 9; an oscillator period corresponds to at least approximately four gate delay times.

Figure 2:
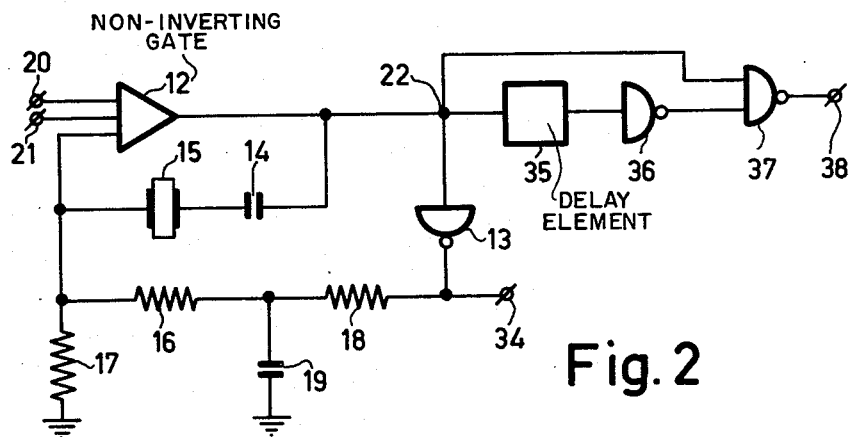
FIG. 2 shows an oscillator circuit according to the invention.

FIG. 2 shows an oscillator circuit according to the invention. The circuit comprises a fast Schottky gate 12, having a logic AND-function, a NAND-gate 13, an oscillator crystal 15, two capacitors 14, 19, three resistors 16, 17, 18 two control input terminals 20, 21 and a signal output terminal 22. The pulse difference between the signals on the two connections to the oscillator crystal 15 is limited. This difference may be negligibly small and in given cases it may have an acceptable value of, for example, from 20° to 30°. If the difference is negligibly small and if during operation the connections to the oscillator element start to carry the signal which corresponds to a logic 1 and the control input terminals 20, 21 also carry a logic 1 (this can take place in the open state as shown), the output of the non-inverting gate 12 also becomes logic 1 after one gate delay time. This signal is applied, via the coupling capacitor 14, to the oscillator element 15. When this element has completed a full cycle of the oscillation used (this may be at the fundamental frequency, but alternatively at a higher harmonic), the said connection thus again assumes a level which corresponds to a logic 1. This oscillation is maintained because the noninverting gate 12 is an active element whereby energy losses in the oscillator circuit can be compensated. The oscillation can be stopped by the application of suitable signals to the terminals 20, 21. On the other hand, it is alternatively possible for those terminals not to be connected (as shown) to further parts of the circuit, so that they carry a signal which does not deviate from a logic 1. By uncoupling these terminals in this manner, the oscillation stopped as described can be started again. In certain cases capacitor 14 may be omitted, its function mainly being the protection of element 15 against dangerous signal peaks. The supply of power to the non-inverting gate 12 is effected in known manner via a supply line which is not shown. The output signal is available at point 22. This output signal is applied to the inverter 13. The output pulses of this gate are applied to the resistor 18 which constitutes an integrating network in conjunction with the capacitor 19. In given circumstances output signals can also be derived from the terminal 34. However, this output must not be overloaded, because the setting of the gate 12 would then change. Because of the action of the integrating network, the voltage on the capacitor 19 is substantially equal to the mean output voltage at terminal 34. On the other hand, at a point 22 a much greater load may be driven because the integrating network by way of feedback will restore the optimum DC level at the output of gate 12. The resistors 16 and 17 constitute a voltage divider and a load for capacitor 19, so that a part of the voltage is added therein to the output signals of the oscillator element 15. The voltage divider is proportioned so that the resultant voltage has a value which lies in the centre of the switching range of the noninverting gate 12, so that small signals superimposed thereon can change the logic signal applied to the said gate in both directions. It is thus possible to generate such signals quickly on the output of the oscillator element, and the ultimate signal can also have a high frequency.

Figure 4:
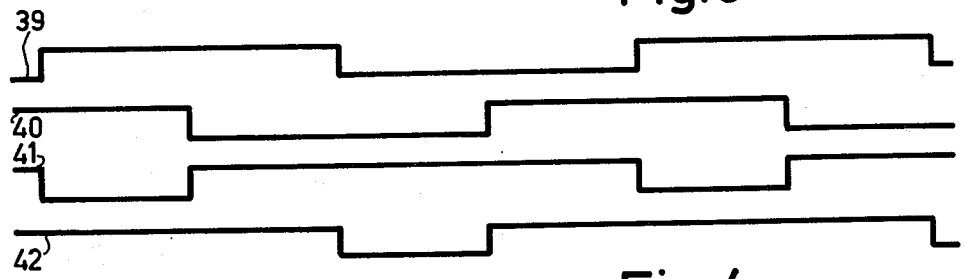
FIG. 4 shows the time diagrams of some signals.

FIG. 2 also shows a delay element 35 and two inverting gates 36, 37 with an output terminal 38. FIG. 4 shows some relevant waveforms. The signal having negligible rise and fall times, which appears on point 22, is shown at 39. Its frequency is, for example, 10 MHz, so that the lengths of the positive and negative signal portions are each approximately 50 ns. The delay element 35 produces a delay of approximately 21 ns, while the inverting gate 36 produces a delay of 4 ns: the output signal of gate 36 is therefore the signal shown at 40 in FIG. 4. The gate 37 is a logic NAND-gate, so that the output signal thereof corresponds to 41 in FIG. 4: this signal is alternately logic 0 for 25 ns and logic 1 for 75 ns. In many systems a double clock pulse is required. There are then two clock pulse lines on which a clock pulse should appear alternately. Output 38 can then serve as one of these. A second clock pulse can be realized in various ways. First of all, the signal shown at 41 can be delayed by 100 ns, so that the signal shown at 42 is obtained. However, it is alternatively possible to combine the signals shown at 39 and 40 by means of a logic OR-circuit.

Figure 3:
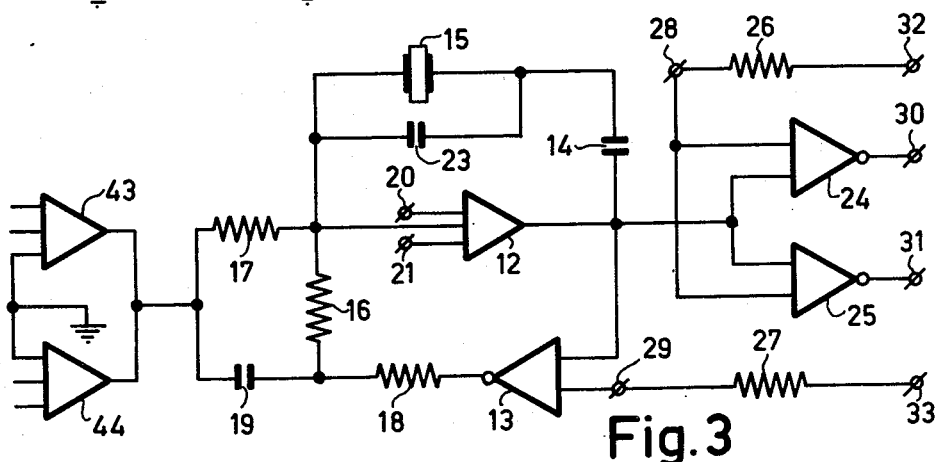
FIG. 3 shows a more detailed diagram of an oscillator circuit according to the invention.

FIG. 3 shows a more detailed diagram of an oscillator circuit according to the invention. The components 12, 13, 14, 15, 16, 17, 18, 19, 20 and 21 correspond to those in FIG. 2. Logic NAND-gates 24, 25, capacitor 23, resistors 26, 27, control terminals 28, 29, supply terminals 32, 33, signal output terminals 30, 31 and logic AND-gates 43, 44 are also provided. The specification of the components is as follows: 16 : 82,5 ohms; 17 : 464 ohms; 18 : 316 ohms; 26, 27 : 3830 ohms; 14, 19 : 100 nf, 23 : 15 pf, 12,43,44 : 9S11 (FAIRCHILD) or 74S11 (MOTOROLA); 13, 24, 25 : 9S00 or 23800.

A known quartz crystal having a fundamental frequency of 14-20 MHz is proposed for the crystal 15. In certain cases, as already stated, a ceramic oscillator element could alternatively be used if given requirements are satisfied. Use is made of Schottky gates (transistor-transistor-logic) for the inverting gates 13, 24, 25, as well as for the noninverting. In certain cases, however, ECL logic (emitter-coupled logic) could alternatively be used. A further advantage of certain ECL gates is the provision therein of both inverted and non-inverted outputs. In that case a single ECL gate may perform both the functions of gates 12, 13. The capacitor 23 is used for short-circuiting the higher harmonics of the frequency used. The frequency used might be the fundamental frequency or, for example, the third harmonic thereof. In the latter case the fifth harmonic would have to be short-circuited. The capacitance 23 may also include the internal capacitance of the oscillator element; an external capacitor can sometimes even be dispensed with. In the case of TTL logic, the terminals 32, 33 should be connected to a supply source of +5 Volts. The two output terminals 30, 31 are capable of supplying numerous elements of a further circuit with clock pulses. Gate 13 can be blocked by a signal having the logic value 0 on terminal 29, with the result that the central input of gate 12 assumes a level which continuously corresponds to logic 1. The oscillation is then stopped. The output signal of gate 12 is then also logic 1. If gate 13 is conducting, the oscillation is dependent only on the presence or absence of an adequate supply voltage for the gates. If this voltage is adequate, oscillation always immediately takes place at the frequency for which oscillator circuit has been adjusted. The use of a quartz crystal is then advantageous, because it is very stable over a wide temperature range.

The logic AND-gates 43, 44 serve to avoid an excessive voltage difference between the logic level "earth" on the input of gate 12 and the "mains earth." In the device used, the addition of these gates does not represent an extension, because they are already present in the module used. The resistance is reduced due to the use of two parallel gates. The left end of the resistor 17 and the capacitor 19 can possibly be directly connected to earth. The circuit can be used at 12-20 MHz.

If the gate 13 is blocked as described above, the gates 24, 25 continuously conduct under the control of the logic output signal (1) of gate 12 and an externally generated clock pulse can be admitted on input 28. This is advantageous, for example, for the transmission of data between two devices, one of which requires a fixed clock signal and the other of which can be synchronized at will.

What is claimed is:

1. A device for the self-triggered generation of a series of cyclically recurring clock pulses, comprising a non-inverting logic gate, a piezoelectric oscillator element having one lead connected to an input and the other lead coupled to the output of the non-inverting gate, and a feedback loop connected between the output and the input of said non-inverting gate, said loop including a series combination of an inverting gate, an integrating network and means for setting the switching voltage of said non-inverting gate.

2. A device as claimed in claim 1, wherein said other lead of said oscillator element is coupled to said non-inverting gate by a capacitor.

3. A device as claimed in claim 1, wherein said non-inverting logic gate is Schottky TTL gate.

4. A device as claimed in claim 1, wherein the said non-inverting gate is an ECL gate.

5. A device as claimed in claim 4, wherein said non-inverting gate and said inverting gate are constituted by means of a single ECL gate having its inverted output connected to an input of said integrating network.

6. A device as claimed in claim 1, wherein said inverting gate has at least one additional control input to block the said series combination by a first signal and to unblock the same by a second signal appearing on said control input.

7. A device as claimed in claim 1, further comprising an inverting delay line and a further inverting gate connected in series to the output of said non-inverting gate.

* * * * *